(12) United States Patent
Nelson et al.

(10) Patent No.: US 9,910,069 B1
(45) Date of Patent: Mar. 6, 2018

(54) BIASING METHOD AND DEVICE CONSTRUCTION FOR A SPRING PROBE

(71) Applicants: Larre H. Nelson, Attleboro, MA (US); John M. Winter, Wrenthom, MA (US); Yoshihide Kimura, Wakayama (JP)

(72) Inventors: Larre H. Nelson, Attleboro, MA (US); John M. Winter, Wrenthom, MA (US); Yoshihide Kimura, Wakayama (JP)

(73) Assignee: KITA USA, Attleboro, MA (US)

( * ) Notice: Subject to any disclaimer, the term of this patent is extended or adjusted under 35 U.S.C. 154(b) by 305 days.

(21) Appl. No.: 14/545,342

(22) Filed: Apr. 24, 2015

(51) Int. Cl.
*G01R 1/067* (2006.01)
(52) U.S. Cl.
CPC .................................. *G01R 1/06722* (2013.01)
(58) Field of Classification Search
CPC .................................................. G01R 1/06722
See application file for complete search history.

(56) References Cited

U.S. PATENT DOCUMENTS

| 3,416,125 | A | 12/1968 | Theue | |
|---|---|---|---|---|
| 7,315,176 | B2 | 1/2008 | Nelson et al. | |
| 8,373,430 | B1 * | 2/2013 | Sochor | H01R 13/2421 29/874 |
| 2005/0280433 | A1 * | 12/2005 | Nelson | G01R 1/06722 324/755.05 |
| 2011/0117796 | A1 * | 5/2011 | Oishi | G01R 1/06722 439/841 |

* cited by examiner

*Primary Examiner* — Daniel Miller
(74) *Attorney, Agent, or Firm* — Robert J Doherty

(57) ABSTRACT

A device for testing integrated circuits utilizing a compression spring that has one longitudinal centerline that is concentric to the housing of the test probe and terminates in a number of reduced diameter coil windings that are non-concentric to the housing so as to provide a side load to the probe.

4 Claims, 3 Drawing Sheets

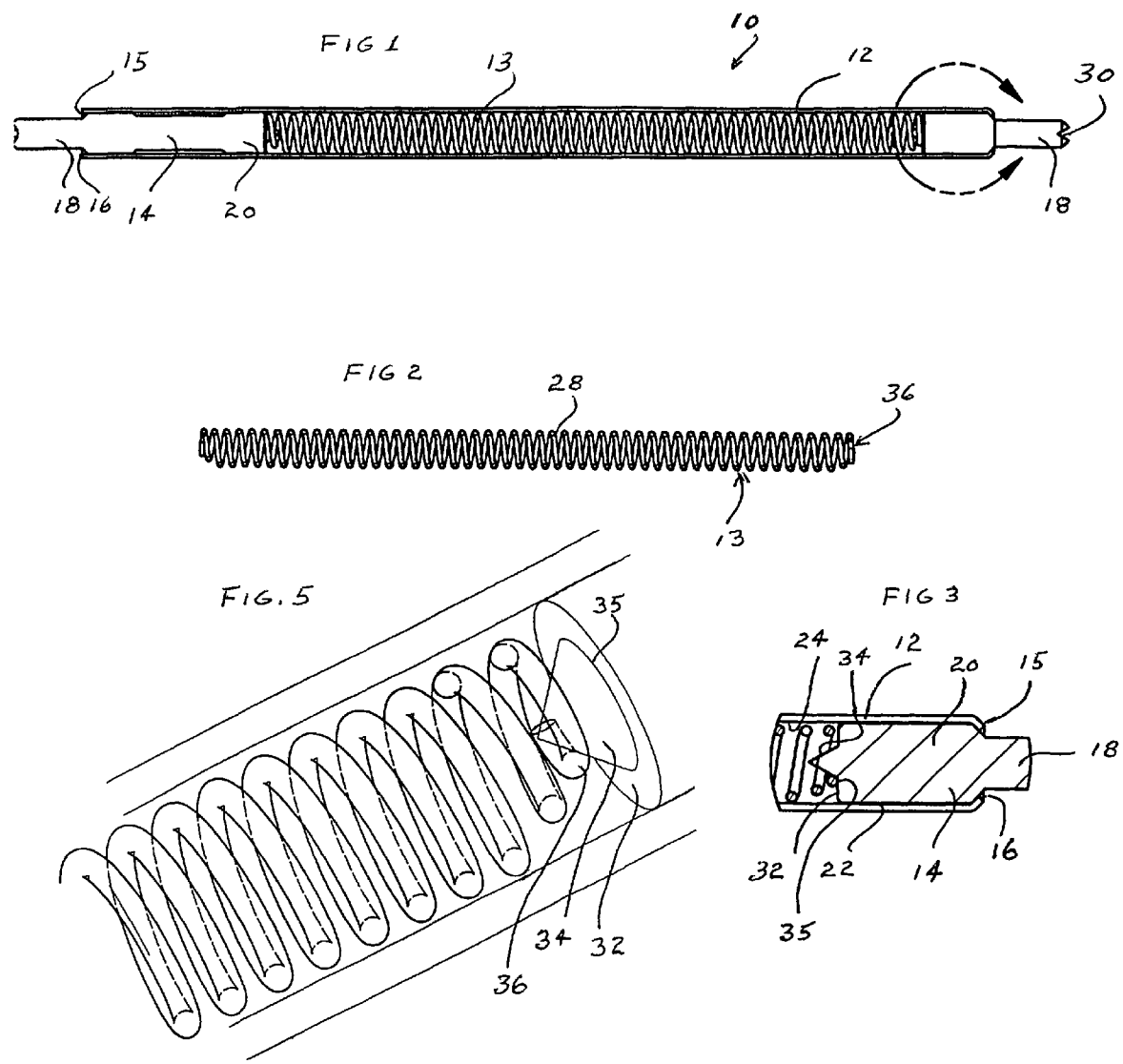

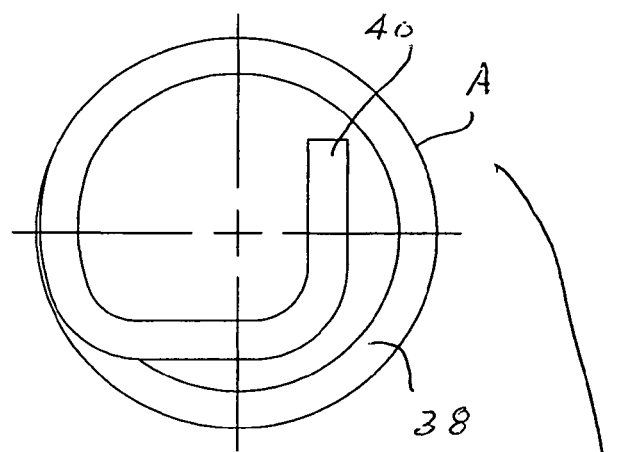
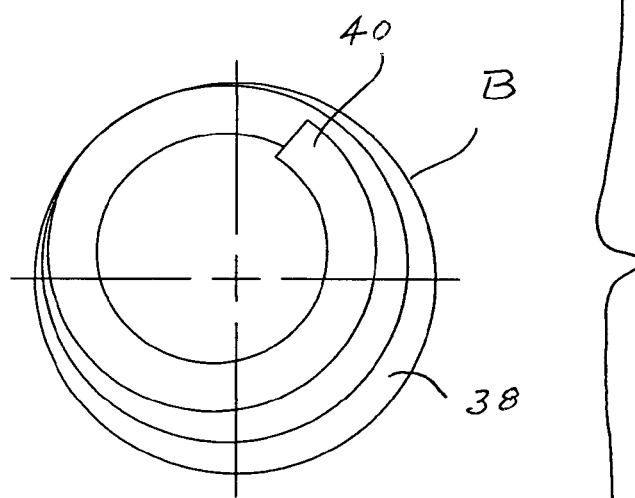
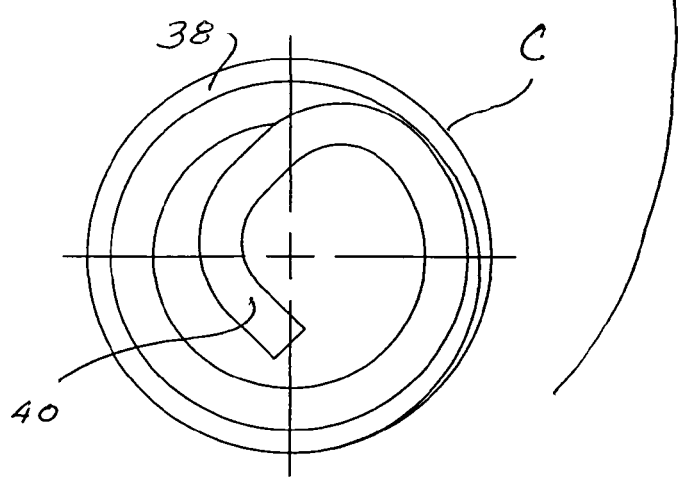
FIG. 4

BIASING METHOD AND DEVICE CONSTRUCTION FOR A SPRING PROBE

Applicants claim the benefit of their U.S. Provisional Patent Application Ser. No. 61/996,202 filed May 2, 2014.

BACKGROUND OF THE INVENTION

Disclosed herein is an electronic test probe incorporating a unique compression spring construction disposed within a housing and in engagement with a plunger. The invention disclosed herein is an unobvious constructional improvement over applicants' previous inventions disclosed in U.S. Pat. No. 7,315,176 issued Jan. 1, 2008. Furthermore, since the background, the manner of use, the procedures for testing integrated circuits and the like are the same as in applicants' present invention and that of the '176 patent, the disclosure of U.S. Pat. No. 7,315,176 is herewith fully incorporated into the present specification by specific reference thereto.

The present invention utilizes a compression spring that has one longitudinal centerline that is concentric to the housing of the test probe and terminates in a limited number of gradually reduced diameter coil windings that are angled off to one side in a non-concentric manner. The end coil winding of the compression spring engages the conical biasing post on the second end of the plunger that is concentric to the housing, and in this manner the plunger creates an optimal side load, that is, a lateral force, to the plunger contained within the housing to insure full electrical contact between the spring and the probe.

A spring-loaded test probe incorporates an actuating plunger with a first end that makes contact with the device under test (DUT) and a second end that is contained within the housing and engages a compression spring that is also contained within the housing. The geometry of the first end of the plunger is based on the nature of the test target on the DUT. The plunger end might have a sharp conical shape, a spherical shape or multiple sharp points. The geometry of the second end of the plunger is based on the desired performance of the test probe.

When a test probe is used in a fixture to test a device, it is desirable to keep the resistance of the test probe as low and consistent as possible. To ensure low and consistent resistance, the metal components inside a test probe must be precisely located in close proximity to each other, and the normal (lateral) force between the components should be high enough to keep the components in direct contact with each other and to break through any surface barrier resistance that might be in place between the components.

This is often accomplished by putting a side load onto the second end of the plunger. Because of the shape of the plunger's second end, some of the longitudinal force of the compression spring can be redirected onto the plunger perpendicularly, that is, laterally, to the housing's centerline. Putting a side load on the plunger increases the normal force of the plunger on the inside surface of the housing.

In previous implementations, test probes have either used a bias cut plunger in conjunction with a ball bearing or a bias cut plunger without a ball bearing and springs with multiple parallel centerlines (see U.S. Pat. No. 3,416,125 to Cooney and U.S. Pat. No. 7,315,176 to Nelson et al). The compression springs are usually constructed with a single centerline that is concentric to the barrel. The diameter of the ends of the springs might be reduced on the same centerline. An alternative spring design described in applicants' aforementioned U.S. Pat. No. 7,315,176 has a spring with multiple parallel centerlines, but the end coils are concentric with the last section of the compression spring coils.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention:

FIG. 1 is a schematic sectional view of an electronic test probe incorporating the present invention;

FIG. 2 is a front elevational view of the configuration of the novel spring construction utilized in the invention;

FIG. 3 is an enlarged schematic sectional view of an end portion of FIG. 1 showing the engagement of the spring and inner probe end;

FIG. 4 is an enlarged end view of the novel spring constructions of the present invention. Note particularly preferred Option B illustrating how the last few coils of the spring terminal end gradually angle to one side;

FIG. 5 is an enlarged stylized perspective view of the engagement of the terminal end coil portion of Option B with the second end of the plunger.

DESCRIPTION OF THE INVENTION

Figure 6:
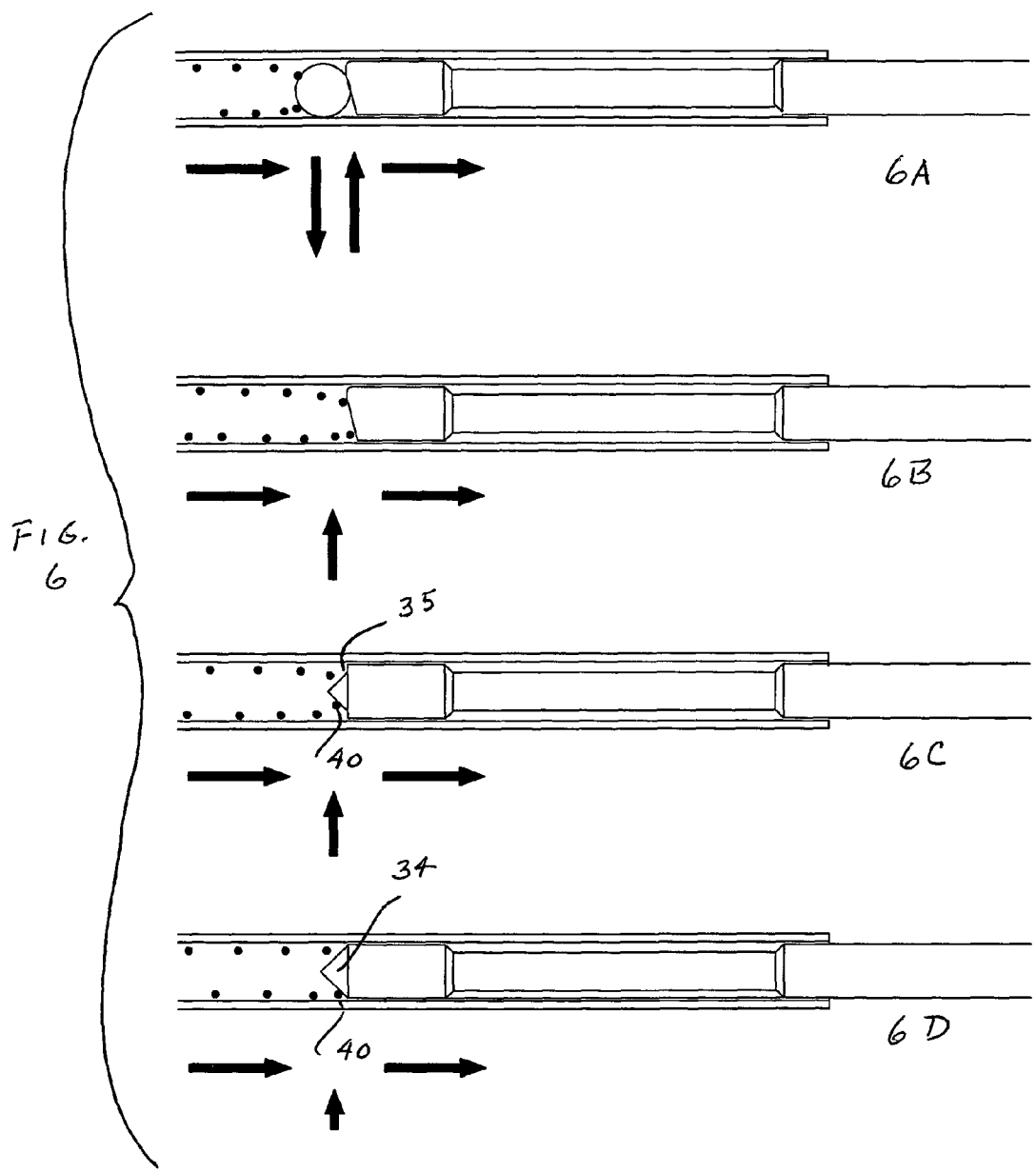
FIG. 6 is a stylized schematic view of various ways of placing a lateral load on a plunger including the preferred manner of the present invention shown in FIG. 6C.

Turning now to the drawings, an electronic test probe 10 is shown in FIG. 1. Such probe 10 comprises a generally tubular housing or barrel 12 in which a compression spring 13 is mounted to apply longitudinal force to at least one and generally two test plungers 14 mounted at one or both of the barrel ends 15. The barrel 12 includes end openings 16 through which a reduced diameter end 18 of the plunger or plungers 14 extend. The plunger 14 further includes a larger diameter portion 20 having an outer cylindrical surface 22 adapted to slidably contact the inner surface 24 of the probe barrel 12 to provide electrical continuity between the barrel 12 and probe 10.

The spring 13 comprises a series of integral coils 26 so as to form a main body 28 having a centerline which is concentric, that is, parallel, with the centerline of the barrel 12. The main body 28 is dimensioned to contact the inner surface 24 of the barrel 12 and continuously apply longitudinal force against the plunger 14' as the plunger makes contact with the circuitry to be tested. The opposite end 18 of the plunger or plungers 14 is provided with a probe tip 30 for such purpose. The larger diameter plunger portion 20 includes an inner surface wall 32 that includes an outwardly extending conical or frustoconical post 34 having a base diameter 35 for contact with the terminal end 36 of the spring 13.

Referring in particular to FIGS. 3 and 4B, the spring terminal end 36 is not concentric with the main body 28. Instead, the last few coils 38 of such terminal end or ends 36, if both barrel ends include a plunger, are of a decreasing spiral-type configuration that is angled off to one side. The last coil winding or terminal end coil portion 40 of such terminal end 36 fits over the conical post 34 and preferably also contacts the base diameter 35 thereof. Applicants' instant invention combines novel geometries of the plunger's second end concentric conical biasing post 34 and the compression spring's non-concentric end coils to achieve the desired side load force that is applied to the plunger's second end.

The concentric conical biasing post 34 incorporates a base diameter that is substantially smaller than the main diameter of the plunger, is long, and preferably has an acute angle) (<60° at the tip. The compression spring 13 has one centerline for the main section or body 28 of the spring 13 and has at least two reduced diameter coils that gradually angle off to one side to form a non-concentric termination. When the non-concentric terminal end 36 of the spring is engaged to the second end of the plunger 14, the conical biasing post 34 projects into the opening in the last coil winding or terminal end coil portion 40 and engages the side of the conical biasing post 34 proximate the base 35 thereof to push the plunger 14 to one side. As the spring 13 is actuated, the side force increases and yields the desired high normal or lateral force between the plunger 14 and the test probe housing or barrel 12.

To ensure a good engagement between the spring 13 and the plunger 14, the end coil winding 40 of the spring 13 should be positioned at the base of the conical biasing post 34. To accomplish this end result, the base diameter of the conical biasing post 34 must be about the same diameter size as the last coil winding 40 of the spring 13.

It should be brought out that the last coil winding or terminal coil end portion 40 need not necessarily be of a continuing coil form and that such portion 40 can take the form of a relatively sharp bend such as shown in FIGS. 4A and 4C so long as providing the desired contact and lateral loading of the probe is achieved. The bends of FIGS. 4A and 4C are, however, more difficult to form; and thus the form shown in FIG. 4B is the preferred form of the invention.

Turning now to FIG. 6, various ways of achieving a side (lateral) load to a probe are shown wherein FIG. 6A shows a separate ball placed between the spring and probe which could also have a flat contact face rather than the bias inclined face shown in FIG. 6A and thus represents known constructions such as shown in U.S. Pat. No. 7,315,176 to Nelson et al. FIG. 6B shows a bias inclined face with no separate ball and is also representative of known constructions. Both of these constructions, that is, FIGS. 6A and 6B, have drawbacks in that a ball introduces a separate and added component and a bias inclined probe face is difficult to machine. The representation of FIGS. 6C and 6D illustrate the present invention with FIG. 6C being the preferred embodiment with the terminal coil end portion 40 in contact with the flat surface shelf 35 of the first plunger.

It should also be pointed out that the conical biasing post 34 can be truncated, if desired, and that the term "conical" includes such a frustoconical shape as well. Additionally, the terms "normal", "lateral", "perpendicular" and "side" are used interchangeably to describe the force applied to the plunger by the novel spring construction of the present invention. The various arrows shown in FIG. 6 represent the estimated direction and relative strength of the forces applied to the plungers While there is shown and described herein certain specific structure embodying this invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An electronic test probe comprising:
   a substantially cylindrical housing with a first end and a second end, and an opening at one or both ends;
   at least one plunger disposed in the housing, the plunger comprising a first end and a second end opposite the first end, the first end of the plunger extending through the opening of the housing; and
   the second end of said plunger having an inner wall surface in turn having a main diameter and wherein said inner wall surface having a conical post contiguous therewith and extending centrally outwardly therefrom, said post including a base diameter which is substantially smaller than the main diameter of the inner wall surface of said plunger wherein that portion of said inner wall surface surrounding said base perimeter defines a flat shelf, said post being a biasing post in turn having a narrowed upper terminus that in turn is engaged into the end coil of a compression spring and a downwardly outwardly flared sloping wall; and wherein
   the compression spring is disposed in the housing in engagement with the second end of the plunger, the compression spring having one centerline for most of the coils and reduced diameter coils at one end thereof and wherein the reduced coils gradually angle to one side in a manner that is not concentric with the rest of the compression spring, the reduced diameter coils terminating in a terminal end coil portion in turn contacting the outer sloping wall of the conical biasing post and exerting lateral pressure thereon.

2. The test probe of claim 1, the terminal end coil portion further positioned in contact with the flat surface shelf of the plunger first end.

3. The test probe of claim 1, wherein more than one plunger is disposed in the housing.

4. The test probe of claim 1, wherein the compression spring has reduced diameter coils at both ends thereof.

* * * * *